United States Patent
Ha (10) Patent No.: US 8,246,289 B2
(45) Date of Patent: Aug. 21, 2012

(54) END EFFECTOR AND ROBOT FOR TRANSFERRING A SUBSTRATE HAVING THE SAME

(75) Inventor: Chong-Eui Ha, Seoul (KR)

(73) Assignee: Semes Co., Ltd., Chungnam (KR)

( * ) Notice: Subject to any disclaimer, the term of this patent is extended or adjusted under 35 U.S.C. 154(b) by 636 days.

(21) Appl. No.: 12/202,580

(22) Filed: Sep. 2, 2008

(65) Prior Publication Data

US 2009/0067974 A1     Mar. 12, 2009

(30) Foreign Application Priority Data

Sep. 6, 2007   (KR) .................. 10-2007-0090220

(51) Int. Cl.
*B25J 15/00* (2006.01)
(52) U.S. Cl. ............... 414/744.5; 294/183; 901/30
(58) Field of Classification Search ......... 414/744.5, 414/744.3, 744.1; 294/64.1, 907; 901/30
See application file for complete search history.

(56) References Cited

U.S. PATENT DOCUMENTS

| | | |
|---|---|---|
| 6,669,434 B2 | 12/2003 | Namba et al. |
| 7,878,562 B2 * | 2/2011 | Hamano et al. ............. 294/213 |
| 2002/0158272 A1 | 10/2002 | Natsume |
| 2007/0020082 A1 | 1/2007 | Caveney et al. |

FOREIGN PATENT DOCUMENTS

| | | |
|---|---|---|
| CN | 1698191 A | 11/2005 |
| JP | 07-106403 | 4/1995 |
| JP | 09-205127 | 8/1997 |
| JP | 2002158272 | 5/2002 |
| TW | 200640767 | 12/2006 |
| TW | 200720035 | 6/2007 |

OTHER PUBLICATIONS

English Summary and First Office Action for the Chinese Publication No. CN 1698191 from the State International Patent Office dated Jul. 24, 2009 for counterpart Chinese patent application.
Office Action dated Feb. 20, 2009 in priority Korean Patent Application No. 2007-90220, 4 pages.
Office Action dated Jul. 24, 2009 for Chinese Patent Application No. 200810215787.8, 5 pages.
Office Action dated Jul. 22, 2011 from Taiwan Patent Office in the corresponding Taiwan Patent Application No. 97133662, 4 pages.
Office Action dated Dec. 30, 2011 from Taiwan Patent Office in the corresponding Taiwan Patent Application No. 97133662, 5 pages.

* cited by examiner

*Primary Examiner* — Donald Underwood
(74) *Attorney, Agent, or Firm* — Daly, Crowley, Mofford & Durkee, LLP (57) ABSTRACT

In a substrate transfer robot, an end effector includes a wrist plate, a first blade movably connected to the wrist plate in a vertical direction to support a first substrate, and a second blade connected to the wrist plate to support a second substrate, wherein the second blade is adjacent to the first blade. An elevating unit moves the first blade upward to allow the first blade to support the first substrate and moves the first blade downward to allow the second blade to support the second substrate.

15 Claims, 5 Drawing Sheets

FIG. 1

PRIOR ART

END EFFECTOR AND ROBOT FOR TRANSFERRING A SUBSTRATE HAVING THE SAME

PRIORITY STATEMENT

This application claims priority under 35 U.S.C. §119 to Korean Patent Application No. 2007-90220, filed on Sep. 6, 2007 in the Korean Intellectual Property Office (KIPO), the contents of which are herein incorporated by reference in their entirety.

BACKGROUND

1. Field

The example embodiments generally relate to an end effector, and a robot for transferring a substrate having the same. More particularly, the example embodiments relate to an end effector for picking up and/or placing a substrate, and a robot for transferring a substrate to a desired position using the end effector.

2. Description of the Related Art

Generally, a semiconductor manufacturing process may include a process for depositing a layer on a substrate such as a semiconductor wafer, a photolithography process for forming photoresist patterns on the deposited layer, an etching process for forming desired circuit patterns using the photoresist patterns, a cleaning process for cleaning the substrate after the etching process, and the like.

Apparatuses for performing the processes may include an airtight chamber unit to provide a high vacuum environment. The chamber unit may include a process chamber, a transfer chamber, a buffer chamber, and the like. The process chamber and the buffer chamber may be disposed around the transfer chamber. A robot for transferring a substrate may be disposed to transfer semiconductor substrates between the process chamber and the buffer chamber.

An example of the substrate transfer robot is disclosed in Japanese Patent Laid-Open Publication No. 2002-158272.

Figure 1:
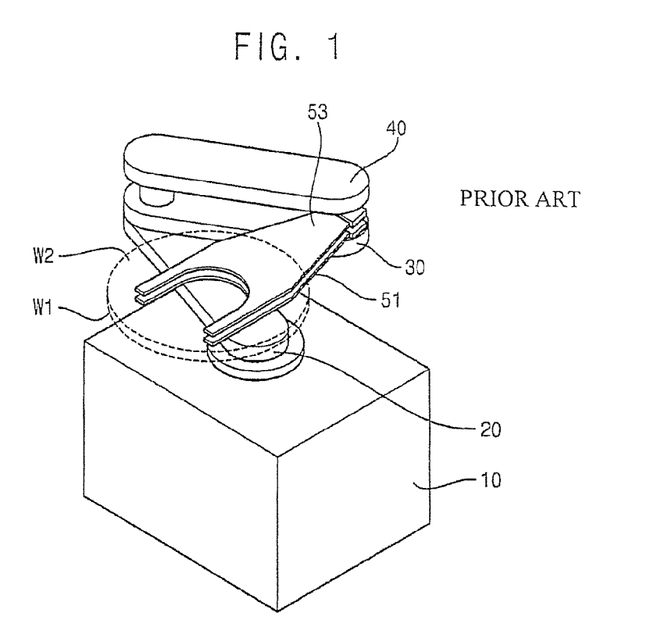
FIG. 1 is a perspective view illustrating a conventional robot for transferring a substrate.

FIG. 1 is a perspective view illustrating a conventional robot for transferring a substrate.

Referring to FIG. 1, a conventional robot for transferring a substrate includes a base arm 20 mounted on a housing 10, first and second end arms 30 and 40 connected to an end portion of the base arm 20, and first and second blades 51 and 53 rotatably connected to end portions of the end arms 30 and 40, respectively. The substrate transfer robot transfers semiconductor substrates W1 and W2 between buffer chambers and process chambers using the blades 51 and 53.

Semiconductor substrates are generally processed in the process chambers using an etching solution or an etching gas. Contaminants such as reaction by-products, the etching solution, and the like, which may remain on the semiconductor substrates, may be removed by a cleaning process, and a drying process on the semiconductor substrates may be performed.

Meanwhile, when the semiconductor substrates are transferred to perform the cleaning process for removing the contaminants, the first and second blades 51 and 53 may be contaminated by the semiconductor substrates. Further, when the cleaned semiconductor substrates are transferred by the contaminated first and second blades 51 and 53 after performing the cleaning process, the cleaned semiconductor substrates may be recontaminated by the contaminated first and second blades 51 and 53.

To solve the problems described above, the semiconductor substrates on which the contaminants remain may be transferred by one of the first and second blades 51 and 53, and the cleaned semiconductor substrates may be transferred by the other one of the first and second blades 51 and 53. For example, in a case where the first blade 51 transfers the semiconductor substrates on which the contaminants remain, the second blade 53 may transfer the cleaned semiconductor substrate 53. As a result, the throughput of a substrate transfer apparatus including the first and second blades 51 and 53 may be deteriorated. That is, the time required to transfer the semiconductor substrates may be increased.

SUMMARY

Example embodiments of the present invention provide an end effector capable of picking up a plurality of substrates at the same time.

Further, example embodiments of the present invention provide a substrate transfer robot having an end effector capable of picking up a plurality of substrates at the same time.

An end effector, in accordance with an aspect of the present invention, may include a wrist plate; a first blade movably connected to the wrist plate in a vertical direction to support a first substrate; and a second blade connected to the wrist plate to support a second substrate, wherein the second blade may be adjacent to the first blade.

In accordance with some example embodiments of the present invention, the end effector may further include an elevating unit for moving the first blade upward to allow the first blade to support the first substrate and for moving the first blade downward to allow the second blade to support the second substrate.

In accordance with some example embodiments of the present invention, the elevating unit may include a driving section for moving the first blade and a controller for controlling the driving section.

In accordance with some example embodiments of the present invention, the first substrate may be any one of a substrate to be processed and a processed substrate, and the second substrate may be the other one of the substrate to be processed and the processed substrate.

In accordance with some example embodiments of the present invention, the end effector may further include stoppers disposed on end portions of the first and second blades to prevent the first and second substrates from failing off the first and second blades.

A robot for transferring a substrate, in accordance with another aspect of the present invention, may include a rotatable housing; a lower arm rotatably connected to the housing; an upper arm rotatably connected to an end portion of the lower arm; and an end effector rotatably connected to an end portion of the upper arm. Here, the end effector may include a wrist plate, a first blade movably connected to the wrist plate in a vertical direction to support a first substrate, and a second blade connected to the wrist plate to support a second substrate, wherein the second blade may be adjacent to the first blade.

In accordance with some example embodiments of the present invention, the end effect may further include an elevating unit for moving the first blade upward to allow the first blade to support the first substrate and for moving the first blade downward to allow the second blade to support the second substrate.

In accordance with some example embodiments of the present invention, the elevating unit may include a driving section for moving the first blade and a controller for controlling the driving section.

In accordance with some example embodiments of the present invention, the end effector may further include stoppers disposed on end portions of the first and second blades to prevent the first and second substrates from falling off the first and second blades.

In accordance with some example embodiments of the present invention, the robot may further include a second end effector including a second wrist plate rotatably connected to the end portion of the upper arm, a third blade movably connected to the second wrist plate in a vertical direction to support a third substrate, and a fourth blade connected to the second wrist plate to support a fourth substrate, wherein the fourth blade may be adjacent to the third blade.

In accordance with some example embodiments of the present invention, the second end effector may further include a second elevating unit for moving the third blade upward to allow the third blade to support the third substrate and for moving the third blade downward to allow the fourth blade to support the fourth substrate.

In accordance with the example embodiments of the present invention as described above, an end effector may include a first blade and a second blade to pick up a substrate to be processed and a processed substrate, respectively. That is, the end effector may pick up both a contaminated substrate and a cleaned substrate, and the throughput of a substrate transfer robot having the end effector may thus be improved.

Further, in a case where the substrate transfer robot has a plurality of end effectors, a plurality of contaminated substrates or a plurality of cleaned substrates may be picked up at the same time. Thus, the time required to transfer the substrates may be shortened.

BRIEF DESCRIPTION OF THE DRAWINGS

Example embodiments of the present invention will become readily apparent along with the following detailed description when considered in conjunction with the accompanying drawings, in which.

DESCRIPTION OF THE EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present invention.

Figure 2:
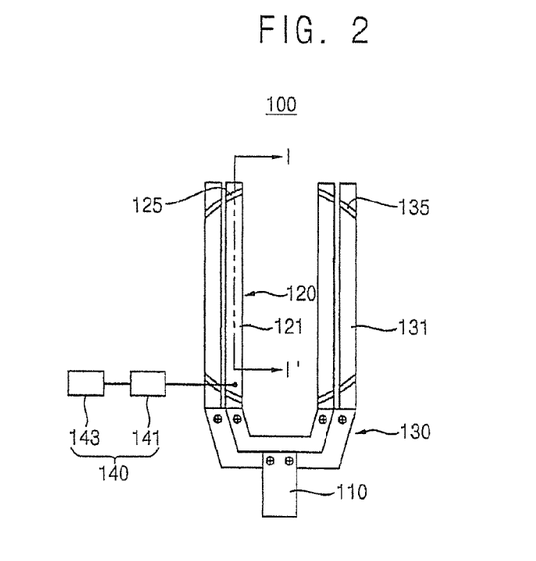
FIG. 2 is a plan view illustrating an end effector in accordance with an example embodiment of the present invention.
Figure 3:
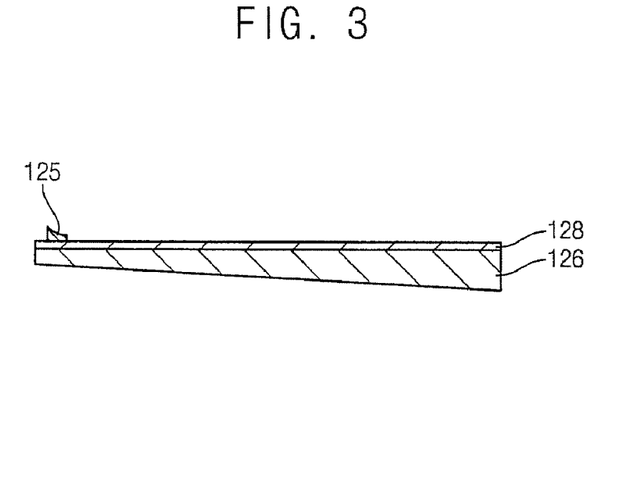
FIG. 3 is a cross-sectional view taken along a line I-I' shown in FIG. 2.

FIG. 2 is a plan view illustrating an end effector in accordance with an example embodiment of the present invention, and FIG. 3 is a cross-sectional view taken along a line I-I' shown in FIG. 2.

Referring to FIGS. 2 and 3, an end effector 100, in accordance with an example embodiment of the present invention, may be used to pick up and transfer semiconductor substrates such as silicon wafers. The end effector 100 may include a wrist plate 110, a first blade 120 and a second blade 130.

The wrist plate 110 may be connected to a frame of a substrate transfer robot (not shown). Further, the wrist plate 110 may be connected with the first and second blades 120 and 130 to support the first and second blades 120 and 130.

For example, the wrist plate 110 may be a hollow plate having a hollow space therein. A sensor (not shown) may be disposed on the wrist plate 110 to sense a semiconductor substrate. For example, the sensor may be a light sensor using light to sense the semiconductor substrate.

The first blade 120 may be connected to an end portion of the wrist plate 110. The first blade 120 may include first fingers 121 for picking up a first substrate, which may be spaced apart from each other.

An end portion of the first blade 120, i.e., end portions of the first fingers 121 may be bent downward when the first substrate is supported by the first blade 120. In accordance with an example embodiment of the present invention, each of the first fingers 121 may have a thickness that is gradually reduced from the end portion of the wrist plate 110 toward the end portions of the first fingers 121. As a result, the weight of the first fingers 121 may be gradually reduced toward the end portions thereof, and the bending of the first fingers 121 may thus be reduced.

Meanwhile, the first blade 120 may have first stoppers 125 to prevent the first substrate from falling off the first blade 120. For example, the first stoppers 125 may be disposed on the end portions of the first fingers 121.

In accordance with an example embodiment of the present invention, each of the first fingers 121 may have a multilayer structure. For example, each of the first fingers 121 may include a first ceramic layer 126 having a first hardness and a second ceramic layer 128 disposed on the first ceramic layer 126 and having a second hardness less than the first hardness. For example, the second ceramic layer 128 may be formed of yttrium oxide ($Y_2O_3$).

As shown in figures, although the first blade 120 includes the pair of first fingers 121, the first blade 120 may include one inner finger. The inner finger may have the same configuration as that of each first finger 121.

The second blade 130 may be connected to the end portion of the wrist plate 110. The second blade 130 may be disposed outside the first blade 120. Particularly, the second blade 130 may include second fingers 131 for picking up a second substrate, which may be disposed adjacent to outside surfaces of the first fingers 121, respectively.

An end portion of the second blade 130, i.e., end portions of the second fingers 131 may be bent downward when the second substrate is supported by the second blade 130. In accordance with an example embodiment of the present invention, each of the second fingers 131 may have a thickness that is gradually reduced from the end portion of the wrist plate 110 toward the end portions of the second fingers 131. As a result, the weight of the second fingers 131 may be gradually reduced toward the end portions thereof, and the bending of the second fingers 131 may thus be reduced.

Meanwhile, the second blade 130 may have second stoppers 135 to prevent the second substrate from falling off the second blade 130. For example, the second stoppers 135 may be disposed on the end portions of the second fingers 131.

The end effector 100 may further include an elevating unit 140. In a case where the wrist plate 110 is a hollow plate, the elevating unit 140 may transmit a driving force for moving the first blade 120 in a vertical direction via a hollow space in the hollow plate.

The elevating unit 140 may include a driving section for moving the first blade 120 and a controller for controlling the driving section. The driving section may be a hydraulic or pneumatic cylinder or a solenoid.

For example, the elevating unit 140 may move the first blade 120 in the vertical direction with respect to the wrist plate 110. When the first blade 120 is positioned above the second blade 130 by the elevating unit 140, the first substrate may be supported by the first blade 120. On the contrary, when the first blade 120 is positioned below the second blade 130 by the elevating unit 140, the second substrate may be supported by the second blade 130.

For example, the first substrate may be a substrate subjected to an etching process, and the second substrate may be a substrate to be subjected to an etching process or a substrate subjected to a cleaning process. That is, contaminants, such as reaction by-products, an etching solution, and the like, may remain on the first substrate, and the first blade 120 may thus be contaminated by the first substrate. However, because the first substrate is supported by the first blade 120 that is positioned above the second blade 130 by the elevating unit 140, the second blade 130 may be prevented from being contaminated. As a result, the contamination of the second substrate may be prevented.

In accordance with another example embodiment of the present invention, the end effector 100 may include a plurality of first blades and a plurality of second blades, and the first blades may be moved in a vertical direction by one or more elevating units. In such a case, the end effector 100 may pick up a plurality of substrates at the same time and may prevent the substrates from being contaminated.

Figure 4:
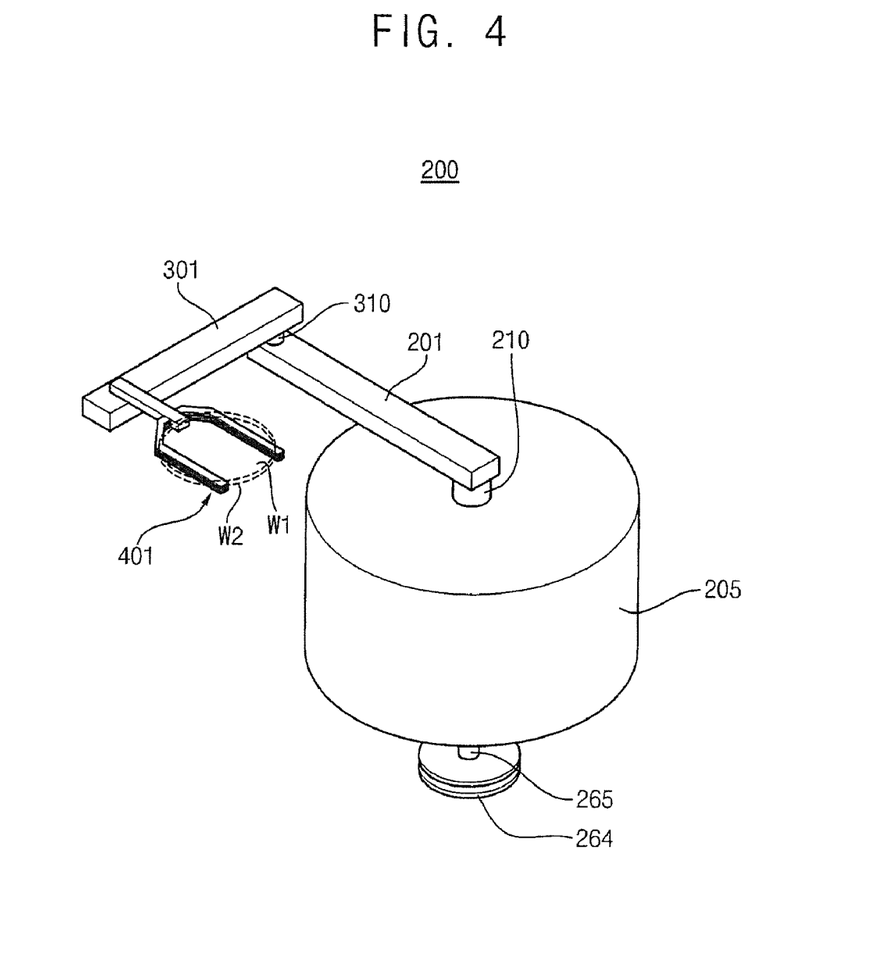
FIG. 4 is a perspective view illustrating a robot for transferring a substrate in accordance with another example embodiment of the present invention.
Figure 5:
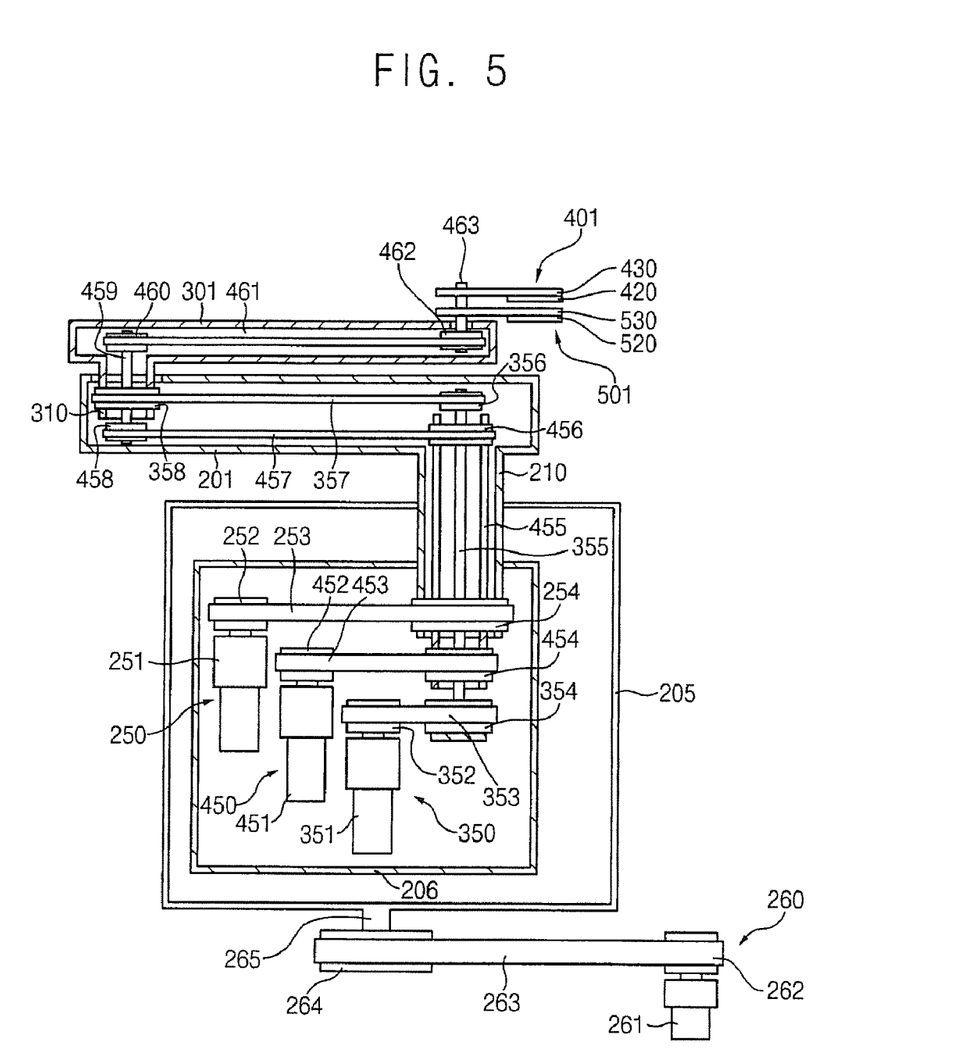
FIG. 5 is a cross-sectional view illustrating the substrate transfer robot shown in FIG. 4.
Figure 6:
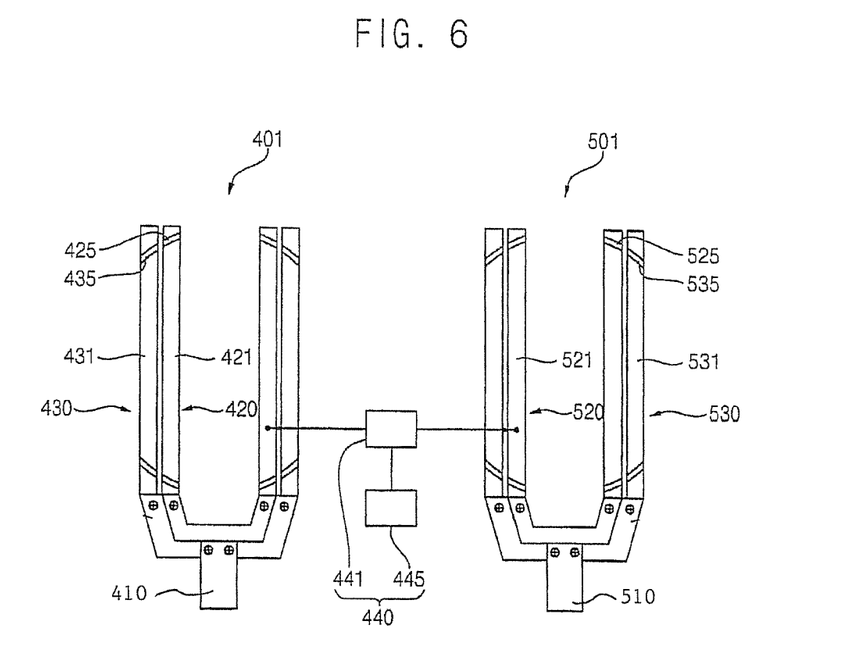
FIG. 6 is a plan view illustrating first and second end effectors shown in FIG. 4.

FIG. 4 is a perspective view illustrating a robot for transferring a substrate in accordance with another example embodiment of the present invention, FIG. 5 is a cross-sectional view illustrating the substrate transfer robot shown in FIG. 4, and FIG. 6 is a plan view illustrating first and second end effectors shown in FIG. 4.

Referring to FIGS. 4 and 5, a robot 200 for transferring a substrate, in accordance with another example embodiment of the present invention, may include a rotatable housing 205, a lower arm 201 rotatably connected to the housing 205, an upper arm 301 rotatably connected to the lower arm 201, and a first end effector 401 rotatably connected to the upper arm 301. The housing 205, the lower arm 201, the upper arm 301 and the first end effector 401 may be rotated by first, second, third and fourth driving units 260, 250, 350 and 450, respectively.

The housing 205 may have a cylinder shape. The housing 205 may be rotated by the first driving unit 260. The first driving unit 260 may include a first motor 261, a first motor pulley 262 connected with a rotary shaft of the first motor 261, a rotary shaft 265 connected with a lower central portion of the housing 205, a housing pulley 264 connected with a lower end portion of the rotary shaft 265, and a first belt 263 for connecting the first motor pulley 262 with the housing pulley 264. Alternatively, the first motor 261 may be directly connected to the lower central portion of the housing 205. A driving box 206 may be disposed in the housing 205.

Meanwhile, the lower rotary shaft 210 may be connected to a first end portion of the lower arm 201. The lower rotary shaft 210 may be a hollow shaft. The lower rotary shaft 210 may extend downward from the first end portion of the lower arm 201 and may be connected to the driving box 206 in the housing 205. Further, the lower arm 201 may be rotated by a motor in the driving box 206.

The upper arm 301 may have a width substantially identical to that of the lower arm 201 and may be connected to a second end portion of the lower arm 201. Further, the upper arm 301 may be rotated by the driving box 206. A first end portion of the upper arm 301 may be connected to the second end portion of the lower arm 201 by an upper rotary shaft 310.

The first end effector 401 may be rotatably connected to a second end portion of the upper arm 301.

Referring to FIG. 6, the first end effector 401 may include a first wrist plate 410, a first blade 420 and a second blade 430.

The first wrist plate 410 may be disposed parallel to an upper surface of the housing 205. The first wrist plate 410 may be rotatably connected to second end portion of the upper arm 301 by a rotary shaft 463 to support the first and second blades 420 and 430.

For example, the first wrist plate 410 may be a hollow plate having a hollow space therein. A sensor (not shown) may be disposed on the first wrist plate 410 to a semiconductor substrate. For example, the sensor may be a light sensor using light to sense the semiconductor substrate.

The first blade 420 may be connected to an end portion of the first wrist plate 410. The first blade 420 may include first fingers 421 to pick up a first substrate, which may be spaced apart from each other.

Meanwhile, the first blade 420 may have first stoppers 425 to prevent the first substrate from falling off the first blade 420. For example, the first stoppers 425 may be disposed on end portions of the first fingers 421.

In accordance with an example embodiment of the present invention, each of the first fingers 421 may have a multilayer structure. For example, each of the first fingers 421 may include a first ceramic layer having a first hardness and a second ceramic layer disposed on the first ceramic layer and having a second hardness less than the first hardness.

The second blade 430 may be connected to the end portion of the first wrist plate 410. The second blade 430 may be disposed outside the first blade 420. Particularly, the second blade 430 may include second fingers 431 to pick up a second substrate, which may be disposed adjacent to outside surfaces of the first fingers 421, respectively.

Meanwhile, the second blade 430 may have second stoppers 435 to prevent the second substrate from falling off the second blade 430. For example, the second stoppers 435 may be disposed on end portions of the second fingers 431.

The first end effector 401 may further include an elevating unit 440 having a driving section 441 and a controller 445. In a case where the first wrist plate 410 is a hollow plate, the elevating unit 440 may transmit a driving force for moving the first blade 420 in a vertical direction via a hollow space in first wrist plate 410.

For example, the elevating unit 440 may move the first blade 420 in the vertical direction with respect to the first wrist plate 410. When the first blade 420 is positioned above the second blade 430 by the elevating unit 440, the first substrate may be supported by the first blade 420. On the contrary, when the first blade 420 is positioned below the second blade 430 by the elevating unit 440, the second substrate may be supported by the second blade 430.

For example, the first substrate may be a substrate subjected to an etching process, and the second substrate may be a substrate to be subjected to an etching process or a substrate subjected to a cleaning process. That is, contaminants, such as reaction by-products, an etching solution, and the like, may remain on the first substrate, and the first blade 420 may thus be contaminated by the first substrate. However, because the first substrate is supported by the first blade 420 that is positioned above the second blade 430 by the elevating unit 440, the second blade 430 may be prevented from being contaminated. As a result, the contamination of the second substrate may be prevented.

In accordance with an example embodiment of the present invention, the substrate transfer robot 200 may further include a second end effector 501. The second end effector 501 may include a second wrist plate 510, a third blade 520 and a fourth blade 530. The third blade 520 may include third fingers 521, and the fourth blade 530 may include fourth fingers 531. Further, third stoppers 525 and fourth stoppers 535 may be disposed on end portions of the third fingers 521 and the fourth stoppers 531, respectively. Further detailed descriptions for the second wrist plate 510, the third blade 520 and the fourth blade 530 will be omitted because these elements are similar to those of the first end effector 401 already described.

The third blade 520 may be moved in a vertical direction by the elevating unit 440. That is, when the third blade 520 is moved upward by the elevating unit 440, the third substrate may be supported by the third blade 520, and when the third blade 520 is moved downward by the elevating unit 440, the fourth substrate may be supported by the fourth blade 530.

In accordance with another example embodiment of the present invention, the second end effector 501 may further include a second elevating unit (not shown) to move the third blade 520 in a vertical direction.

Referring again to FIGS. 4 and 5, a second driving unit 250 may include a second motor 251 disposed in the driving box 206. A second motor pulley 252 may be connected to a rotary shaft of the second motor 251. A lower arm pulley 254 may be connected to a lower end portion of the lower rotary shaft 210. A second belt 253 may connect the second motor pulley 252 with the lower arm pulley 254.

A third driving unit 350 may include a third motor 351 disposed in the driving box 206 and an upper arm rotary shaft 355 disposed in the lower rotary shaft 210. A third motor pulley 352 may be connected to a rotary shaft of the third motor 351. An upper arm driving pulley 354 may be connected to a lower end portion of the upper arm rotary shaft 355. A third belt 353 may connect the third motor pulley 352 with the upper arm driving pulley 354. Further, an upper arm driven pulley 356 may be connected to an upper end portion of the upper arm rotary shaft 355. An upper arm main pulley 358 may be connected to the upper rotary shaft 310. A fourth belt 357 may connect the upper arm driven pulley 356 with the upper arm main pulley 358.

A fourth driving unit 450 may include a fourth motor 451 disposed in the driving box 206 and first, second and third spindles 455, 459 and 463. The first spindle 455 may be disposed in the lower rotary shaft 210. The first spindle 455 may be a hollow shaft, and the upper arm rotary shaft 355 may be disposed in the first spindle 455. The second spindle 459 may be disposed in the upper rotary shaft 310. The third spindle 463 may be rotatably disposed in the second end portion of the upper arm 301 and may extend upward.

A fourth motor pulley 452 may be connected to a rotary shaft of the fourth motor 451. A first spindle driving pulley 454 may be connected to a lower end portion of the first spindle 455. A fifth belt 453 may connect the fourth motor pulley 452 with the first spindle driving pulley 454. A first spindle driven pulley 456 may be connected to an upper end portion of the first spindle 455. A second spindle driving pulley 458 may be connected to a lower end portion of the second spindle 459. A sixth belt 457 may connect the first spindle driven pulley 456 with the second spindle driving pulley 458. A second spindle driven pulley 460 may be connected to an upper end portion of the second spindle 459. A blade pulley 462 may be connected to a lower end portion of the third spindle 463. A seventh belt 461 may connect the second spindle driven pulley 460 with the blade pulley 462.

As a result, the housing 205, the lower arm 201, the upper arm 301, and the first and second end effectors 401 and 501 may be rotated by the first, second, third and fourth driving units 260, 250, 350 and 450, respectively.

A method of transferring substrates using the substrate transfer robot 200 will be described more fully hereinafter with reference to the accompanying figures.

Figure 7:
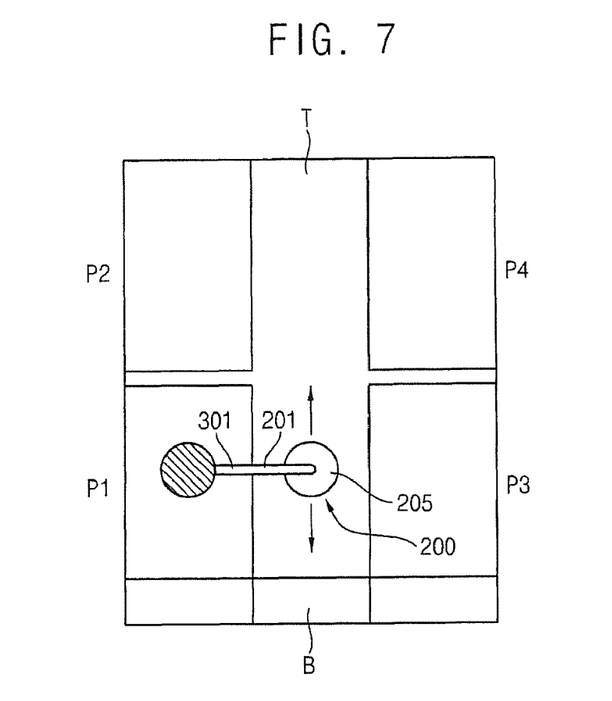
FIGS. 7 and 8 are plan views illustrating a method of transferring substrates using the substrate transfer robot shown in FIG. 4.
Figure 8:
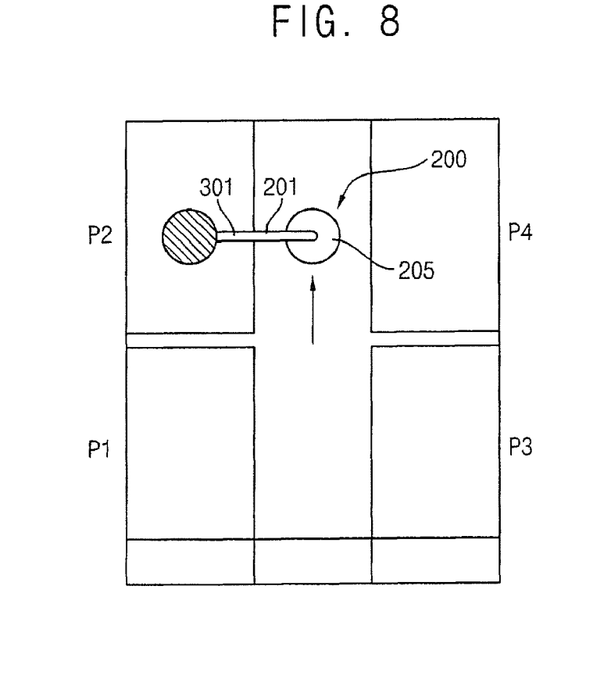

FIGS. 7 and 8 are plan views illustrating a method of transferring substrates using the substrate transfer robot shown in FIG. 4.

Referring to FIG. 7, the substrate transfer robot 200 may be disposed in a transfer chamber T which may be disposed among a buffer section B and first, second, third and fourth process chambers P1, P2, P3 and P4. That is, the first, second, third and fourth process chambers P1, P2, P3 and P4 and the buffer section B may be disposed centering on the transfer chamber T.

First, the elevating unit 440 may lift up the first blade 420 of the first end effector 401 and the third blade 520 of the second end effector 501. Thus, the first and third blades 420 and 520 may be positioned above the second and fourth blades 430 and 530. Then, the substrate transfer robot 200 may pick up the first substrates received in the buffer section B at the same time by using the first and third blades 420 and 520. The first substrates may be transferred into the first process chamber P1 by the lower arm 201 and the upper arm 301, and a first substrate supported by the first blade 420 may be loaded onto a support (not shown) disposed in the first process chamber P1.

Referring to FIG. 8, the substrate transfer robot 200 may move toward the second process chamber P2, and a first substrate supported by the third blade 520 may be loaded onto a support (not shown) disposed in the second process chamber P2. As a result, the first substrates may be picked up the substrate transfer robot 200 at the same time and may be sequentially loaded into the first and second process chambers P1 and P2.

Meanwhile, substrates (hereinafter referred to as "second substrates," which are processed in the first and second process chambers P1 and P2) may be transferred into the buffer section B by the substrate transfer robot 200. For example, etching or cleaning processes on the first substrates may be performed in the first and second process chambers P1 and P2, respectively.

In detail, the first blade 420 and the third blade 520 may be moved downward by the elevating unit 440, and the second blade 430 and the fourth blade 530 may thus be positioned above the first blade 420 and the third blade 520.

The second substrates may be sequentially picked up by the second and fourth blades 430 and 530 and may be unloaded from the first and second process chambers P1 and P2. The unloaded second substrates may be transferred into the buffer section B and may then be placed onto supports (not shown) in the buffer section B at the same time.

In accordance with the example embodiments of the present invention as described above, an end effector may include a first blade and a second blade to pick up a substrate to be processed and a processed substrate, respectively. That is, the end effector may pick up both a contaminated substrate and a cleaned substrate, and the throughput of a substrate transfer robot having the end effector may thus be improved.

Further, in a case where the substrate transfer robot has a plurality of end effectors, a plurality of contaminated substrates or a plurality of cleaned substrates may be picked up at the same time. Thus, the time required to transfer the substrates may be shortened.

Although the example embodiments of the present invention have been described, it is understood that the present invention should not be limited to these example embodiments but various changes and modifications can be made by those skilled in the art within the spirit and scope of the present invention as hereinafter claimed.

What is claimed is:

1. An end effector comprising:
   a wrist plate;
   a first blade movably connected to the wrist plate in a vertical direction and configured to support a first substrate;
   a second blade connected to the wrist plate and configured to support a second substrate, the second blade being adjacent to the first blade; and
   an elevating unit configured to move the first blade above the second blade, to move the first blade below the second blade and to move the first blade level with the second blade with the second blade disposed outside the first blade and the first blade disposed inside the second blade,
   wherein the first substrate is one of a substrate to be processed and a processed substrate, and the second substrate is the other one of the substrate to be processed and the processed substrate.

2. The end effector of claim 1 wherein the elevating unit is configured to move the first blade upward to allow the first blade to support the first substrate and is configured to move the first blade downward to allow the second blade to support the second substrate.

3. The end effector of claim 1, wherein the elevating unit comprises a driving section for moving the first blade and a controller for controlling the driving section.

4. The end effector of claim 1, further comprising stoppers disposed on end portions of the first and second blades to prevent the first and second substrates from falling off the first and second blades.

5. A robot for transferring a substrate comprising:
   a rotatable housing;
   a lower arm rotatably connected to the housing;
   an upper arm rotatably connected to an end portion of the lower arm;
   an end effector comprising a wrist plate rotatably connected to an end portion of the upper arm, a first blade movably connected to the wrist plate in a vertical direction and configured to support a first substrate, and a second blade connected to the wrist plate and configured to support a second substrate, the second blade being adjacent to the first blade; and
   an elevating unit configured to move the first blade above the second blade, to move the first blade below the second blade and to move the first blade level with the second blade with the second blade disposed outside the first blade and the first blade disposed inside the second blade, wherein at least one of the first blade and the second blade comprises a finger member extending from the wrist plate, and wherein a thickness of the finger member is reduced as the finger member extends away from the wrist plate.

6. The robot of claim 5, wherein the elevating unit is configured to move the first blade upward to allow the first blade to support the first substrate and is configured to move the first blade downward to allow the second blade to support the second substrate.

7. The robot of claim 6, wherein the elevating unit comprises a driving section for moving the first blade and a controller for controlling the driving section.

8. The robot of claim 5, wherein the end effector further comprises stoppers disposed on end portions of the first and second blades to prevent the first and second substrates from falling off the first and second blades.

9. The robot of claim 5, further comprising a second end effector comprising a second wrist plate rotatably connected to the end portion of the upper arm, a third blade movably connected to the second wrist plate in a vertical direction to support a third substrate, and a fourth blade connected to the second wrist plate to support a fourth substrate, the fourth blade being adjacent to the third blade.

10. The robot of claim 9, wherein the second end effector further comprises a second elevating unit for moving the third blade upward to allow the third blade to support the third substrate and for moving the third blade downward to allow the fourth blade to support the fourth substrate.

11. An end effector comprising:
a wrist plate;
a first blade movably connected to the wrist plate in a vertical direction and configured to support a first substrate; and
a second blade connected to the wrist plate and configured to support a second substrate, the second blade being adjacent to the first blade; and
an elevating unit configured to move the first blade above the second blade, to move the first blade below the second blade and to move the first blade level with the second blade with the second blade disposed outside the first blade and the first blade disposed inside the second blade,
wherein at least one of the first blade and the second blade comprises a finger member extending from the wrist plate, and
wherein a thickness of the finger member is reduced as the finger member extends away from the wrist plate.

12. The end effector of claim 11 wherein the finger member comprises:
a first ceramic layer having a first hardness; and
the second layer having a second hardness less than the first hardness and disposed on the first ceramic layer.

13. The end effector of claim 12 wherein the second ceramic layer is yttrium oxide.

14. The robot of claim 5 wherein at least one of the first blade and the second blade comprises a finger member extending from the wrist plate,
wherein a thickness of the finger member is reduced as the finger member extends away from the wrist plate, and
wherein the finger member comprises:
a first ceramic layer having a first hardness; and
the second layer having a second hardness less than the first hardness and disposed on the first ceramic layer.

15. The robot of claim 14 wherein the second ceramic layer is yttrium oxide.

* * * * *